(12) United States Patent
Bondarenko et al.

(10) Patent No.: US 10,459,011 B2
(45) Date of Patent: Oct. 29, 2019

(54) METHOD FOR MULTIPLEXING WHEATSTONE BRIDGE MEASUREMENTS

(71) Applicant: Halliburton Energy Services, Inc., Houston, TX (US)

(72) Inventors: Oleg Bondarenko, Spring, TX (US); Wei Zhang, Houston, TX (US); Timothy S. Glenn, Dracut, MA (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 15/100,264

(22) PCT Filed: Dec. 31, 2013

(86) PCT No.: PCT/US2013/078479
§ 371 (c)(1),
(2) Date: May 27, 2016

(87) PCT Pub. No.: WO2015/102613
PCT Pub. Date: Jul. 9, 2015

(65) Prior Publication Data
US 2017/0023620 A1 Jan. 26, 2017

(51) Int. Cl.
| | | |
|---|---|---|
| *G01R 17/02* | (2006.01) | |
| *G01R 19/25* | (2006.01) | |
| *H04Q 9/00* | (2006.01) | |
| *G08C 15/02* | (2006.01) | |
| *G08C 19/04* | (2006.01) | |
| *G01V 1/22* | (2006.01) | |
| *G01V 1/24* | (2006.01) | |

(Continued)

(52) U.S. Cl.
CPC .......... *G01R 17/02* (2013.01); *G01R 19/2509* (2013.01); *G08C 15/02* (2013.01); *G08C 19/04* (2013.01); *H04Q 9/00* (2013.01); *G01V 1/22* (2013.01); *G01V 1/245* (2013.01); *G01V 3/26* (2013.01); *G01V 3/34* (2013.01); *H04Q 2209/823* (2013.01)

(58) Field of Classification Search
CPC ....... G01R 31/026; G01R 31/40; F42C 21/00; H02J 9/061
See application file for complete search history.

(56) References Cited

U.S. PATENT DOCUMENTS

| | | |
|---|---|---|
| 2,425,868 A | 8/1947 | Dillon |
| 3,028,528 A | 4/1962 | Ghiselin, Jr. |

(Continued)

FOREIGN PATENT DOCUMENTS

KR 20090083125 8/2009

OTHER PUBLICATIONS

579028, RD, Jul. 10, 2012, Abstract only.
(Continued)

*Primary Examiner* — Akm Zakaria
(74) *Attorney, Agent, or Firm* — Chamberlain Hrdlicka

(57) ABSTRACT

A system, method, and circuit for determining signals. A bridge output is received from a Wheatstone bridge sensing a slow signal and a fast signal. A slow output associated with the slow signal and a fast output associated with the fast signal are determined from the bridge output utilizing a microcontroller. The microcontroller generates the offset signal in response to the slow output. Other systems, methods, and circuits are disclosed.

18 Claims, 4 Drawing Sheets

(51) Int. Cl.
*G01V 3/26* (2006.01)
*G01V 3/34* (2006.01)

(56) References Cited

U.S. PATENT DOCUMENTS

| | | | |
|---|---|---|---|
| 3,841,152 | A | 10/1974 | Guest |
| 4,590,579 | A * | 5/1986 | Erb .................... G01N 9/24 327/100 |
| 5,459,319 | A * | 10/1995 | Norsworthy ............ G01J 1/44 250/332 |
| 5,493,906 | A | 2/1996 | Sen-Zhi |
| 5,544,079 | A | 8/1996 | Saikalis |
| 5,668,320 | A | 9/1997 | Cowan |
| 6,112,162 | A | 8/2000 | Richards |
| 6,125,695 | A | 10/2000 | Alvesteffer et al. |
| 6,304,074 | B1 | 10/2001 | Waffenschmidt |
| 6,349,477 | B1 | 2/2002 | Hunter |
| 6,547,016 | B2 | 4/2003 | Wassell |
| 6,686,733 | B2 | 2/2004 | Muth |
| 6,973,837 | B2 | 12/2005 | Barnett |
| 7,362,255 | B1 * | 4/2008 | Tsyrganovich ......... H03M 3/34 341/155 |
| 7,530,274 | B2 | 5/2009 | Kurtz et al. |
| 7,536,908 | B2 | 5/2009 | Wang et al. |
| 7,647,843 | B2 | 1/2010 | Burton |
| 8,061,213 | B2 | 11/2011 | Kurtz et al. |
| 8,197,133 | B2 | 6/2012 | Schultz et al. |
| 8,276,459 | B2 | 10/2012 | Kurtz et al. |
| 2004/0064270 | A1 * | 4/2004 | Luchner ................ G01F 1/696 702/45 |
| 2005/0012588 | A1 | 1/2005 | Sultan et al. |
| 2005/0239230 | A1 | 10/2005 | Yang et al. |
| 2006/0005619 | A1 | 1/2006 | Renninger et al. |
| 2008/0180090 | A1 * | 7/2008 | Stolfus .................. G01D 5/145 324/174 |
| 2008/0236273 | A1 | 10/2008 | Dmytriw et al. |
| 2009/0056466 | A1 | 3/2009 | Moran et al. |
| 2009/0212847 | A1 * | 8/2009 | Schultz ................ G01F 1/6965 327/513 |
| 2009/0217754 | A1 * | 9/2009 | Binda ..................... G01C 5/06 73/384 |
| 2010/0016990 | A1 * | 1/2010 | Kurtz ...................... A61F 2/58 623/24 |
| 2015/0260671 | A1 * | 9/2015 | Press ..................... G01N 27/06 324/706 |

OTHER PUBLICATIONS

International Search Report and Written Opinion of PCT Application No. PCT/US2013/078479 dated Sep. 30, 2014: pp. 1-13.
Anonymous, "Pressure sensors and weigh scales (force sensing)," Maxim Industrial Solutions, retrieved Apr. 24, 2013: pp. 59-92, <www.maxim-ic.com/sensor>.
Anonymous, "Thermal Gas Mass Flow Measurement and Control Instrumentation," Eldridge Products, Inc., Apr. 2007, retrieved Apr. 24, 2013: pp. 1-16.

* cited by examiner

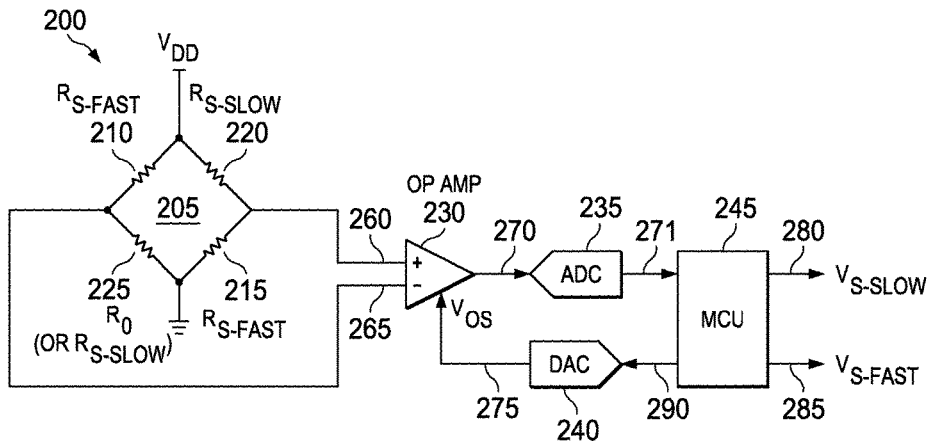
FIG. 2
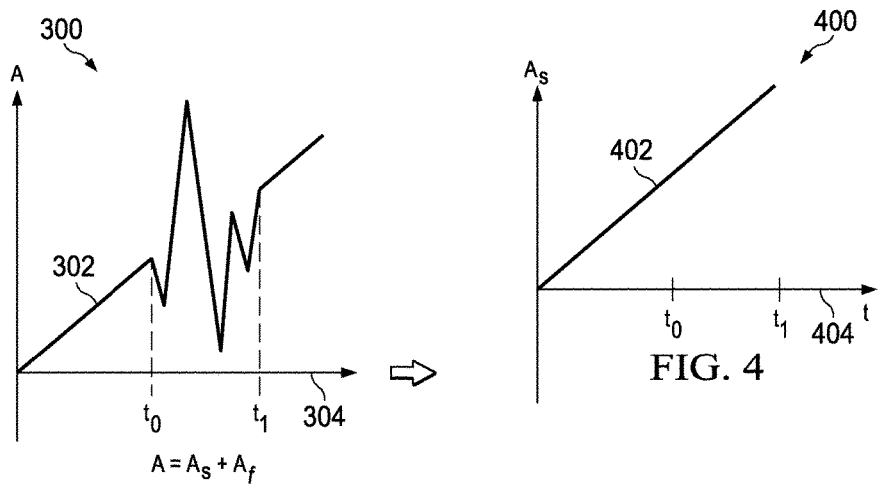
FIG. 3
FIG. 4
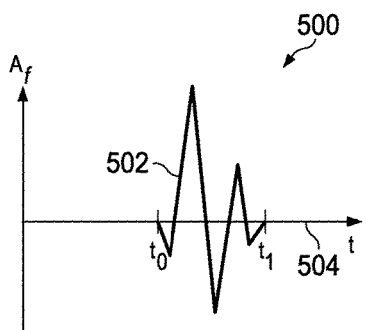
FIG. 5

_US 10,459,011 B2_

METHOD FOR MULTIPLEXING WHEATSTONE BRIDGE MEASUREMENTS

BACKGROUND

Electronic circuits are utilized in a number of conditions and environments to perform measurements. The measurements may include parameters that may change rapidly or slowly. In some cases, performing the distinct measurements may require bulky circuits to maintain a desirable level of precision and accuracy.

BRIEF DESCRIPTION OF THE DRAWINGS

Illustrative embodiments of the present invention are described in detail below with reference to the attached drawing figures, which are incorporated by reference herein and wherein:

FIG. 2 is a schematic diagram of a circuit in accordance with an illustrative embodiment;

FIG. 3 is a graphical representation of a combination of a fast output and a slow output in accordance with an illustrative embodiment;

FIG. 4 is a graphical representation of a slow output in accordance with an illustrative embodiment;

FIG. 5 is a graphical representation of a fast output in accordance with an illustrative embodiment.

DETAILED DESCRIPTION OF THE DRAWINGS

The illustrative embodiments provide a system, method, and circuit for multiplexing two temporally distinct signals. In one embodiment, the circuit includes a Wheatstone bridge that combines a number of signals. The distinct signals may be received for multiplexing. A Wheatstone bridge multiplexes the distinct signals (or voltages) generated by distinct sensors that make up the Wheatstone bridge for processing by the other portions of the circuit. The illustrative embodiments may be utilized to compensate for changes in a slow signal to properly process a fast signal.

Any number of thresholds may be utilized to determine whether there is a change in the bridge outputs from the Wheatstone bridge and whether the change is indicative of a fast change or a slow change. Fast changes may happen over a very short duration of time, whereas the slow changes are much more gradual. In one embodiment, an offset signal compensates for gradual changes in the bridge outputs in response to determining that the change in the bridge output is a slow change. The offset signal may be used as a reference voltage by an operational amplifier.

The illustrative embodiments provide that a single circuit may be used to measure two different signals that may represent slow sensor measurements and fast sensor measurements. The two different signals may be multiplexed together and then separated utilizing a microcontroller to determine a slow output and a fast output. The circuit may include any number of components including, but not limited to, an array of sensors (e.g., a Wheatstone bridge) configured to detect fast and slow signals, one or more operational amplifiers, one or more analog-to-digital converters, one or more digital-to-analog converters, and one or more microcontrollers or microprocessors. The various components may be interconnected or communicate utilizing wires, pins, traces, wireless transceivers, and other mediums.

The illustrative embodiments allow measurements to be taken with a circuit that is relatively reduced in size and more efficient than other circuits for similar purposes. The illustrative embodiments may also be implemented within an application-specific integrated circuit, field programmable gate array, analog circuitry, or a combination thereof. As a result, size and price may be reduced while still tracking important information related to fast changing parameters and slow changing parameters. The systems and methods for multiplexing are well suited for use in oil and gas related contexts.

Figure 1A:
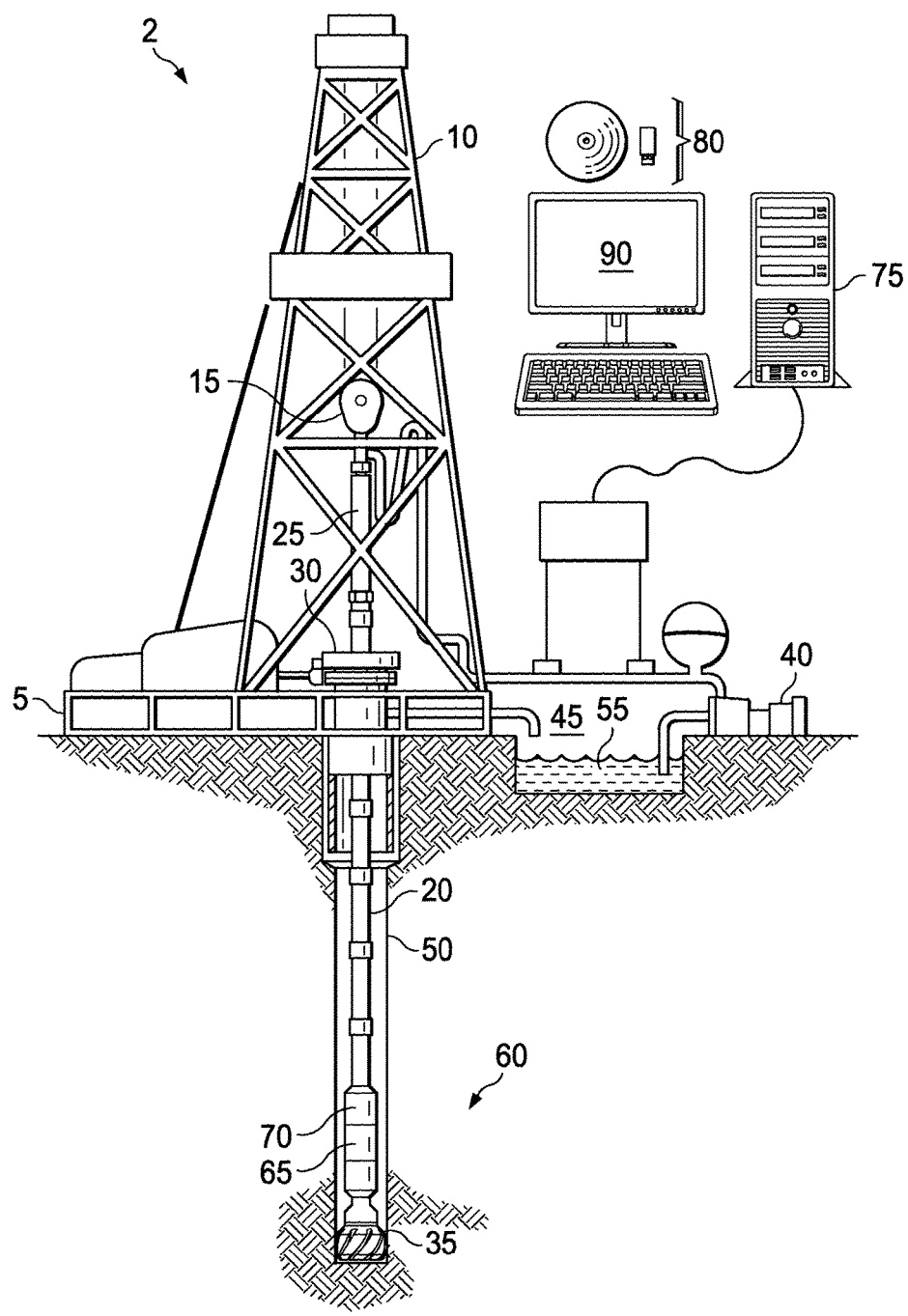
FIG. 1A is a schematic representation of a logging-while-drilling environment in accordance with an illustrative embodiment.

FIG. 1A shows an illustrative logging-while-drilling (LWD) environment 2. A drilling platform 5 is equipped with a derrick 10 that supports a hoist 15. The rig operator drills an oil or gas well for production or exploration using a string of drill pipes 20. The hoist 15 suspends a top drive 25 that rotates the drill string 20 as it lowers the drill string 20 through the wellhead 30. Connected to the lower end of the drill string 20 is a drill bit 35. The drill bit 35 is rotated and drilling accomplished by rotating the drill string 20, by use of a downhole motor near the drill bit 35 or the top drive 25, or by both methods.

In one embodiment, recirculation equipment 40 pumps drilling or other fluids through supply pipe 45, through top drive 25, and down through the drill string 20 at high pressures and volumes to emerge through nozzles or jets in the drill bit 35. The drilling fluid then travels back up the hole via the annulus formed between the exterior of the drill string 20 and the borehole wall 50, through blowout preventers, and into a retention pit 55, reservoir, or enclosed receptacle on the surface. On the surface, the drilling fluid may be cleaned and then recirculated by the recirculation equipment 40. The drilling fluid may be utilized to carry cuttings from the base of the bore to the surface and balance the hydrostatic pressure in the rock formations in the LWD environment 2.

The bottomhole assembly 60 (i.e., the lowermost part of drill string 20) may include thick-walled tubulars called drill collars, which add weight, stability, and rigidity to aid the drilling process. The thick walls of these drill collars make them useful for housing instrumentation, tools, and LWD sensors. For example, the bottomhole assembly 60 of FIG. 1 may include one or more sensor tools 65 (also referred to as a sensing circuit) and a communications and control module 70. In one embodiment, the one or more sensor tools 65 may include the circuits and sensor components as are herein described. In other embodiments, the one or more sensor tools 65 may be incorporated in other components of the drill string 20 for taking various measurements or elsewhere altogether.

The one or more sensor tools 65 or the bottomhole assembly 60 may include a natural gamma ray detector, a resistivity tool, a nuclear magnetic resonance tool, a neutron porosity tool, or other exploration tools. Other sensor tools 65 and sensors may also be included in the bottomhole assembly 60, including without limitation, position sensors, orientation sensors, accelerometers, compasses, pressure sensors, temperature sensors, radiation sensors, vibration sensors, and so forth.

From the various bottomhole assembly 60 sensors, the communications and control module 70 (telemetry module)

collects data regarding the formation properties and/or various drilling parameters, tool configurations and readings, and stores the data in internal memory. In addition, some or all of the data may be transmitted to the surface by wireline communications, wireless communications, magnetic communications, seismic communications, mud telemetry, or so forth.

For example, the communications and control module 70 may communicate information, data, or signals generated by the sensor tool 65. The sensor tool 65 may generate raw and/or unprocessed data that may be received, converted to an electrical signal, digitized, and processed into data by one or more control, computing, or communications devices of the LWD environment 100. A computer 75 operates in accordance with software (which may be stored on information storage media 80) and user input received via an input device to process and decode the received signals. The resulting sensory and telemetry data may be further analyzed and processed by computer 75 to generate a display of useful information on a computer monitor 90 or some other form of a display device or output. For example, a driller may employ the system of the LWD environment 2 to obtain and view information related to natural resource exploration, evaluation, and analysis.

Figure 1B:
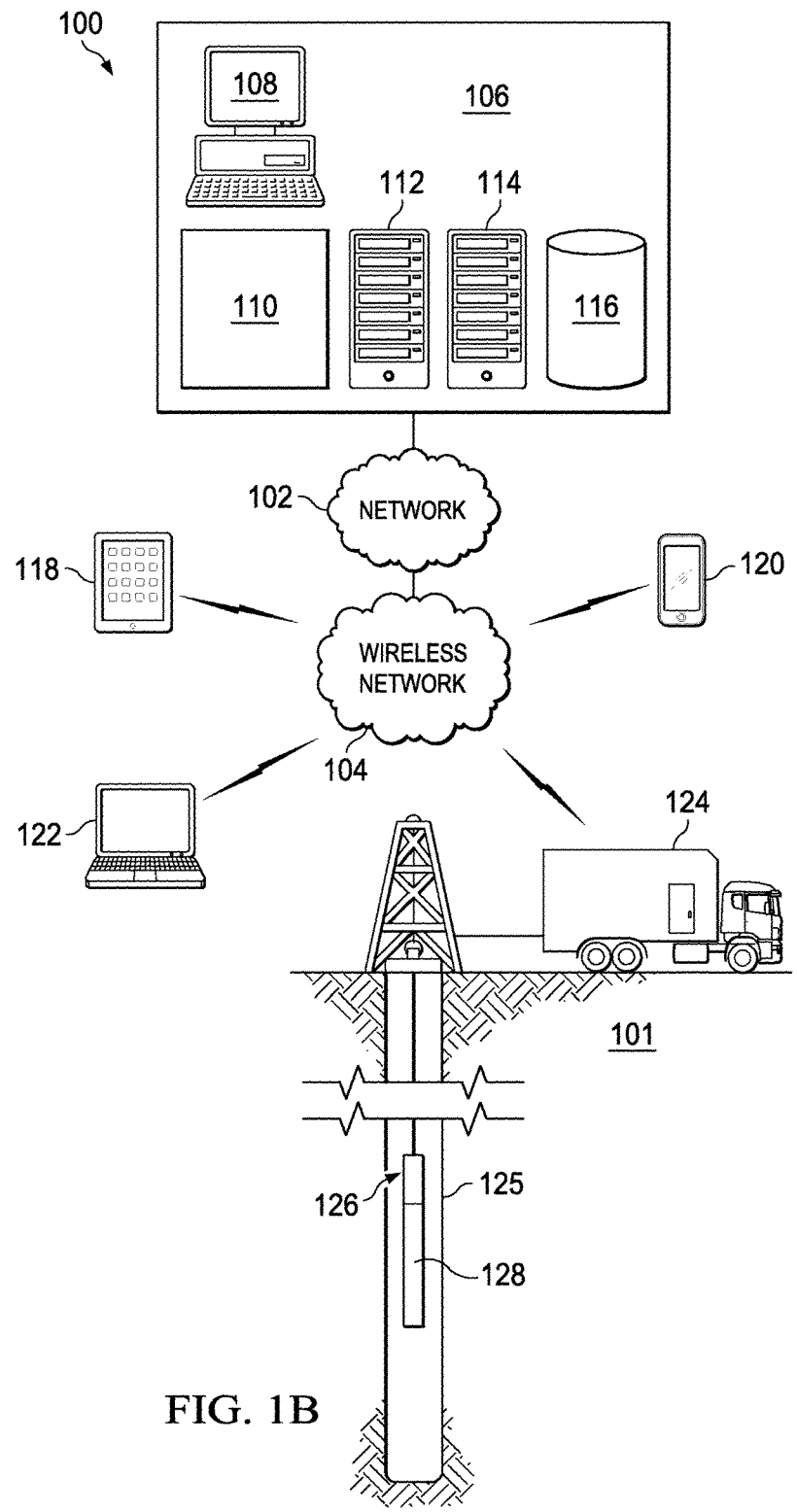
FIG. 1B is a schematic representation of a wireline logging environment in accordance with an illustrative embodiment.

FIG. 1B is a wireline logging environment 100 in accordance with an illustrative embodiment. The wireline logging environment 100 may include a number of tools, devices, locations, systems, and equipment that may be utilized with the circuits, sensor systems, and methods herein described. For example, a logging tool may include the sensors for sensing change in temperature as well as sudden pressure changes due to a collapse, explosion, or other intense pressure event. The wireline logging environment 100 may include a reservoir 101. The reservoir 101 is a designated area, location, or three-dimensional space that may include natural resources, such as crude oil, natural gas, or other hydrocarbons. The illustrative embodiments may utilize measurement, computational, and statistical analysis that may be performed by any number of devices in any number of locations. For example, the measurements and computations may be performed downhole, on-site, off-site, at a movable location, at a headquarters, utilizing fixed computational devices, or utilizing wireless devices.

In one embodiment, the processes herein described may be performed utilizing specialized sensor tools, including sensors, logic, interconnects, power sources, and other similar electrical components. The logic of the sensor tool may include processors, memories, field-programmable gate arrays (FPGAs), application-specific integrated circuits (ASICs), computer instructions, code, programs, or applications, or any combination of software, hardware, and firmware.

In one embodiment, the wireline logging environment 100 may include one or more of the following: a network 102, a wireless network 104, a facility 106, a personal computer 108, a management system 110, servers 112 and 114, a database 116, a tablet 118, a wireless device 120, a laptop 122, and a mobile computing system 124. The mobile computing system 124 may include downhole equipment 126 and tool 128. In one embodiment, the illustrative embodiments including the circuit(s) and sensory components herein described are incorporated in the tool 128.

The network 102 may be any type of computing or communications network including one or more of the following networks: a wide area network, a local area network, one or more private networks, the Internet or public networks, a telephone network (e.g., publicly switched telephone network), one or more cellular networks, cloud networks, virtual networks, and other wireless and data networks.

The wireless network 104 is one example of a wireless network for regional or local communications (e.g., WiFi, 4G, LTE, PCS, Bluetooth, Zigbee, WiMAX, GPRS, etc.). The network 102 and the wireless network 104 may include any number of network nodes, devices, systems, equipment, and components (not depicted), such as routers, servers, network access points/gateways, cards, lines, wires, switches, DNS servers, proxy servers, web servers, and other network nodes and devices for assisting in routing and computation of data/communications as herein described.

In one embodiment, integrated or external components of the mobile computing system 124 may be configured to penetrate an earth formation through a wellbore 125 to stimulate, energize, or measure parameters of a formation. As used herein, "or" does not require mutual exclusivity. One or more sensors or logging tools (e.g., probes, drill string measurement devices, nuclear magnetic resonance imagers, etc.) may be integrated with or connected to the downhole equipment 126 and tool 128 and communicate with the mobile computing system 124 to perform measurements, logging, data retrieval, data storage, processing, or information display. For example, the mobile computing system 124 may determine any number of static and dynamic properties. The static and dynamic properties may include measurements of or changes in pressure, depth, temperature, composition (e.g., hydrocarbon composition levels, measurements, and statistics), fluid flow rate, fluid composition, strain, density, porosity, position and displacement, depth, and so forth that relate to the reservoir 101, the exploration tools, or other monitored components.

The tool 128 may represent any number of wireline, slickline, or other logging tools. In other embodiments, the tool 128 may represent any number of measurement-while-drilling (MWD), seismic-while-drilling (SWD), logging-while-drilling (LWD) tools, or other downhole or reservoir tools. In one embodiment, the tool 128 may remain oriented in a particular direction or may rotate the sensors to enhance measurements made by the tool 128.

The measurements taken by the tool 128 may come from the reservoir 101, the wellbore 125, laboratory equipment, the downhole equipment 126, or any number of other sources. In one embodiment, waves are generated by a kinetic, seismic, or explosive tool integrated with or in communication with the mobile computing system 124.

The personal computer 108, tablet 118, wireless device 120, laptop 122, or mobile computing system 124 may execute a local program or app to retrieve and utilize the measurements acquired in the process herein described. In another embodiment, the tool computations and analysis may be performed by the management system 110, servers 112 and 114, or other network devices. For example, the user may submit information and parameters utilizing the wireless device 120 to perform the calculations on the server 112 with the results being stored in the database 116 for subsequent access. The database 116 may store the sensor orientation information, bias information, default properties, measurements, static properties, dynamic properties, flow simulation results (e.g., initial values, partial output, and completed output), parameters, configuration, settings, and so forth. The database 116 may be accessed by any number of users and devices in the flow simulation environment to retrieve and update the data.

In one embodiment, the servers 112 and 114 may execute an application that is available to any of the devices of the wireline logging environment 100 through the network 102 and the wireless network 104. For example, the application may include a user interface for displaying the fast parameters and the slow parameters. In one embodiment, the server 114 is a Web server that hosts the application for downhole measurement processing that is accessible through one or more browsers utilized by any of the personal computer 108, tablet 118, wireless device 120, laptop 122, or mobile computing system 124.

FIG. 2 is a schematic diagram of a circuit 200 in accordance with an illustrative embodiment. The circuit 200 may be integrated with any number of systems, devices, components, or sensor tools. In one embodiment, the circuit 200 may be integrated within a downhole tool utilized for natural resource exploration. In one embodiment, the circuit 200 is integrated as portion of a custom or mass manufactured circuit board.

For example, the circuit 200 may be utilized to measure fast measurements (e.g., shock) in response to a perforation gun in an environment where slow measurement (e.g., temperature) may affect the measurements in response to the perforating gun. As a result, the circuit 200 may be configured to extract the fast signal from the slow signal as well as offset the temperature differential to perform proper compensation.

In one embodiment, the circuit 200 may include a Wheatstone bridge 205 including sensor resistors 210, 215, 220, and 225, an operational amplifier 230, analog-to-digital converter (ADC) 235, digital-to-analog converter (DAC) 240, microcontroller 245, slow output 280, and fast output 285. The circuit 200 may further include any number of connections that represent wires, traces, pins, or other connectors between the components of the circuit 200. In another embodiment, the distinct components of the circuit may communicate wirelessly (utilizing radio frequency signals and one or more transmitter, receiver, or transceivers) or through light communications (e.g., fiber optics).

In one embodiment, the Wheatstone bridge 205 is an electrical circuit used to perform electrical measurements of the sensor resistors 210-225 in opposite legs of the Wheatstone bridge 205. In one embodiment, the sensor resistors 210-225 are located in a location external or separate from the other portions of the circuit 200. The sensor resistors 210-225 may represent resistive sensors or any number of other sensors utilized to make various measurements.

The Wheatstone bridge 205 may combine two different signals or channels read from the sensor resistors 210-225 in the single Wheatstone bridge 205. The resolution of the sensor resistors 210-225, ADC 235, and DAC 240 may vary based on the application. In one embodiment, the sensor resistors 210 and 215 may be configured to sense, detect, or measure a fast-changing signal or parameter. For example, the sensor resistors 210 and 215 may measure mechanical strain, shock, acceleration, pressure, vibration, tension, compression, or other fast-changing parameters. For example, the fast signals may represent measurements when an object under test explodes, breaks, is dropped, injected, cracked, or so forth. The fast changing parameters may be dynamic only or categorized as AC-coupled.

In one embodiment, the fast changing parameters may not have a static (DC) or quasi-static component because it may be difficult to distinguish between the slow varying component of the fast changing parameter and the multiplexed slow changing parameters. In one embodiment, the bandwidths of the distinct sensors may not overlap. However, overlap may be allowed where the DC signal component is below the noise floor of a sensor (e.g., high-g acceleration) and does not interfere with the other slow changing parameters.

The sensor resistors 220 and 225 may be configured to sense, detect, or measure a slow changing signal or parameter. For example, the sensor resistors 220 and 225 may measure temperature, radiation, inclination (angle), speed, power supply or battery voltage, density, conductivity, electrical field strength, battery or other slow-changing parameters. The slow signal sensors represented by the sensor resistors 220 and 225 and the fast signal sensors represented by the sensor resistors 210 and 215 are connected in the opposite bridge legs of the Wheatstone bridge 205. The slow signals may represent parameters that do not change significantly when a short-term measurement event occurs (e.g., explosion, collisions, etc.). An event may indicate that there is relevant data to capture or record. The event may also be considered a determination of a change in absolute value above a threshold. In one embodiment, the event may represent a physical or electrical stimulus, such as an explosion or an electrical glitch that is responsible for a fast changing response sensed by the sensor resistors 210 and 215 of the Wheatstone bridge 205. In another embodiment, recording of an event may be represented by an array of samples taken during a time interval while the fast changing signal value is not constant and the peak of the change is above a pre-selected threshold.

In another embodiment, the circuit 200 may be utilized to measure power supply voltage and acceleration using the same circuit 200, knowing that the tool in which the circuit 200 is embedded consumes power at a known rate that is not likely to vary with time (e.g., the tool consuming a steady 20-mA current from a 10-Ah battery) and that the acceleration may jump to a peak magnitude within a sub-millisecond interval (e.g., car crash, perforating gun shot, etc.).

The Wheatstone bridge 205 is connected to an operational amplifier 230 by bridge outputs 260 and 265. In one embodiment, the operational amplifier 230 is a direct-current coupled high-gain electronic voltage amplifier with a differential input and a single-ended output. The operational amplifier, or op amp, may produce an output 270 ($V_o$) (relative to the ground of the circuit 200) that is hundreds or thousands of times larger than the potential difference between bridge outputs 260 and 265 (differential outputs) from the Wheatstone bridge 205 to the op amp 230. The operational amplifier 230 may further amplify the signals received from the bridge outputs 260 and 265 as well as adjust, modify, or compensate the bridge outputs 260 and 265 to generate output 270 based on an offset signal ($V_{os}$) 275. The operational amplifier 230 may perform amplification operations as well as offset operations distinctly.

In one embodiment, the output 270 is converted to a digital output 271 by the ADC 235. The ADC 235 and the DAC 240 may be controlled by the microcontroller 245. In one embodiment, the microcontroller 245 is a single integrated circuit (or small computing device) containing a processor core, memory, and programmable input/output peripherals. The microcontroller 245 may include digital logic, software instructions, firmware, or a combination thereof configured to perform all or portions of the processes herein described.

The processor (not shown) of the microcontroller 245 is circuitry or logic enabled to control execution of a set of instructions. The processor may include one or more microprocessors, digital signal processors, application-specific integrated circuits (ASIC), central processing units, or other devices suitable for controlling an electronic device including one or more hardware and software elements, executing software, instructions, programs, and applications, converting and processing signals and information, and performing other related tasks.

The processor may be a single chip or integrated with other computing or communications elements, such as the microprocessor 245. The memory (not shown) of the microcontroller 245 is a hardware element, device, or recording media configured to store data for subsequent retrieval or access at a later time. The memory may be static or dynamic memory. The memory may include a hard disk, random access memory, cache, removable media drive, mass storage, or configuration suitable as storage for data, instructions, and information. In one embodiment, the memory, processor, and microcontroller 245 may be integrated. The circuit 200 may include or use any type of volatile or non-volatile storage techniques and mediums.

In one embodiment, the microcontroller 245 may be configured to output slow output 280 and a fast output 285. The microcontroller 245 may utilize a timer to sample, read, or measure the digital output 271 at a preselected delay or time period. In another embodiment, the processing may be performed in response to external stimuli or in response to significant changes in the digital output 271. As the slow output 280 changes based on measurements determined by the sensor resistors 220 and 225, the microcontroller 245 computes an offset 290 that is converted to the offset signal 275 or offset voltage by the DAC 240. The microcontroller 245 may also control gain of the operational amplifier 230 to maintain signal integrity of the slow output 280 and the fast output 285. Gain may be controlled by the microcontroller 245 as a fail-safe as the offset signal 275 is increased or decreased to maximum levels and the slow output 280 and the fast output 285 are still being clipped (also referred to as saturated or chopped) or otherwise negatively affected.

The offset signal 275 may be utilized by the operational amplifier 230 to compensate the output 270. In one embodiment, the output 270 may be continuously balanced at a virtual ground (e.g., the midpoint between $V_{dd}$ and ground). The circuit 200 may be balanced by continuous adjustment of the offset signal 275 produced by the DAC 240. The offset signal 275 is controlled by the microcontroller 245 with the slow signal amplitude being equal to the difference abs $(V_{bal}-V_{dac})$, where $V_{bal}$ is the balanced voltage level (e.g $V_{dd}/2$) and $V_{dac}$ is the offset voltage 275 from the DAC 240. So, while the ADC 235 input remains constant (unless the fast signal starts to change), the microcontroller 245 keeps track of the slow signal amplitude and compensates the slow signal changes by applying $V_{dac}=-V_{slow}$ as the offset signal 275 (DAC output). For example, by utilizing the offset signal 275 for compensation, the circuit may ensure that variations of the fast output 285 measured by the sensor resistors 210 and 215 remain balanced between the power rails and are not clipped by the operational amplifier 230. For example, the output of the sensor resistors 210 and 215 (fast output) may be affected by the changes sensed by the sensor resistors 220 and 225 (slow output), such as changes in temperature, radiation, magnetic field changes, or so forth. If the offset signal 275 were not generated by the microcontroller 245, various parameters such as temperature may slowly, but significantly, vary the fast output 285 such that the full measurement may not be received.

The offset signal 275 is generated by the microcontroller 245 proportional to the slow output 280 measured by the sensor resistors 220 and 225. The multiplexed slow output from sensor resistors 220 and 225 may be inferred (indirectly measured) from the amount of offset signal needed to balance the circuit 200. If the output 270 is determined to be a fast output as communicated to the microcontroller 245 as a digital signal from the ADC 235, the digitized output 271 may be recorded by the microcontroller 245 as a fast signal or event and may not result in a change of the offset 290 communicated to the DAC 240. In one embodiment, the slow signals sensed by the sensor resistors 220 and 225 in real-time may be processed or saved at a slow rate (e.g., 1-100 Hz). The fast signals sensed by the sensor resistors 210 and 215 may be processed and/or saved at a high rate (e.g., 0.01-10 MHz). For example, the fast signal may be saved during an interval where the slow signal drift does not affect the measurement result more than some required error (e.g., 1 or 2 bits).

In another embodiment, the microcontroller 245 may represent an application-specific integrated circuit (ASIC) or field-programmable gate array (FPGA) configured to perform all or a portion of the functions herein described. In one embodiment, an ASIC circuit may include FPGA components including various analog and/or digital components (e.g., amplifiers, ADCs, DACs, etc.) that may be dynamically configured to perform the methodology herein described utilizing instructions or feedback generated in real time. For example, the microcontroller 245 may communicate with an external sensor array as represented by the Wheatstone bridge 205. The microcontroller 245 may execute a set of instructions or configure logic for performing all of the functions of the operational amplifier 230, the ADC 235, and the DAC 240. For example, the microcontroller 245 may execute a set of instructions stored in a memory to process the sensor readings for both slow signals and fast signals.

Any number of algorithms may be utilized by the microcontroller 245 to demultiplex the fast and slow signals utilizing an algorithm, instructions, and/or logic. In addition, the microcontroller 245 may utilize any number of algorithms or digital logic to determine whether one or more thresholds are met. For example, the slow signals may be utilized to generate an offset for better processing of the fast signals. The thresholds may indicate whether any significant changes are detected from the sensors and whether the changes are indicative of a slow signal requiring an offset adjustment or a fast signal for performing additional processing.

Turning now to FIGS. 3-5 showing graphs 300, 400, and 500, respectively, graph 400 shows a slow signal $(A_s)$ 402 or slow output as it changes over time 404. For example, the slow signal 402 may show changes in voltage over time. However, any number of other conditions or parameters may be measured. Graph 500 shows a fast signal $(A_f)$ 502 or fast output as it changes over time 504. The graph 300 shows a sum (A) 302 over time 304. The graph 300 may be described as the multiplexed sum of the slow signal 402 and the fast signal 502 or $A=A_s+A_f$. As shown by the sum 302, the slow signal 402 acts as an offset to the fast signal 502. The microcontroller 245 of FIG. 2 is configured to separate the sum 302 of FIG. 2 into the slow signal 402 of FIG. 4 and the fast signal 502 of FIG. 5.

The Wheatstone bridge 105 of circuit 200 of FIG. 2 may be utilized to multiplex two different signals as shown in the graph 300 of FIG. 3. In one embodiment, the microcontroller 245 may separate (or demultiplex) the signals to generate the associated or respective outputs. In another embodiment, the signals may be demultiplexed utilizing analog filters. The illustrative embodiments may allow the size and power consumption of the circuit 200 to be significantly reduced by reducing necessary components. In addition, because the microcontroller 245 is monitoring both signals simultaneously, the digital signal processing may be simplified. In another embodiment, the slow signal 402 and the fast signal 502 may be separated using low-pass and high pass analog filters.

Figure 6:
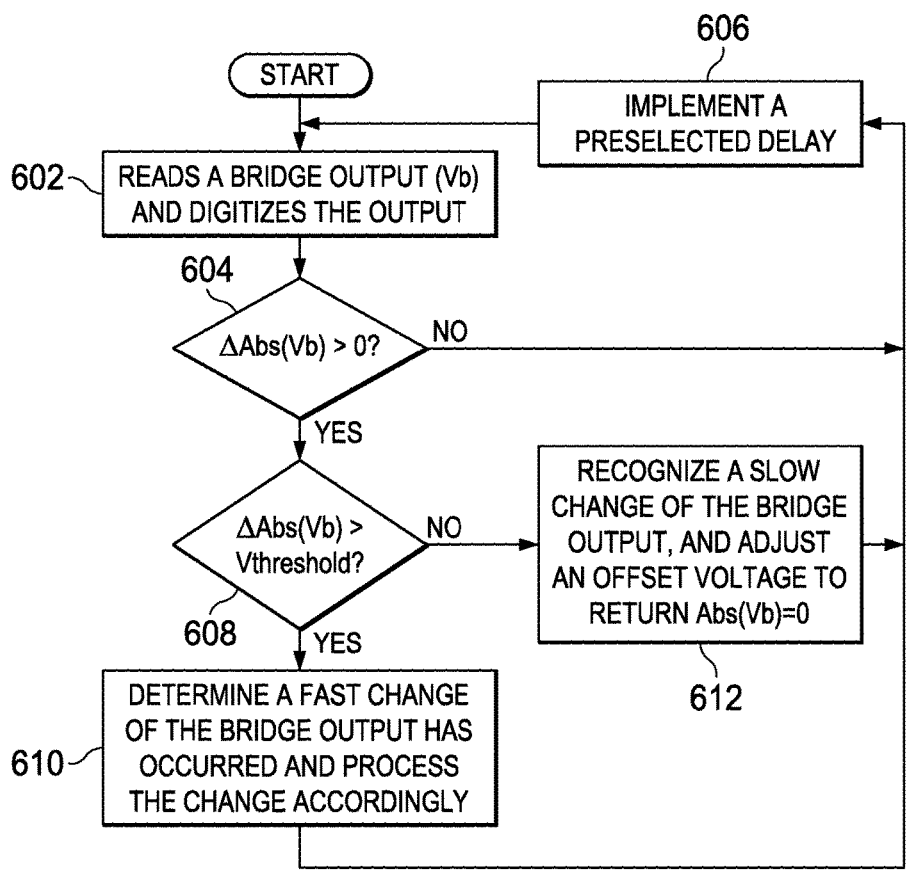
FIG. 6 is a flowchart of a process for determining signals in accordance with an illustrative embodiment.

FIG. 6 is a flowchart of a process for determining signals in accordance with an illustrative embodiment. The process of FIG. 6 may be implemented by a number of measurement devices, circuits, or systems. For example, the process of FIG. 6 may be implemented by a circuit (system), such as that shown in FIG. 2.

The process may begin with the system reading a bridge output that has been digitized (step 602). In one embodiment, the bridge output is from a Wheatstone bridge configured to measure fast signals and slow signals. The output from the Wheatstone bridge may be digitized by an ADC. The digitized signal is then read by the microcontroller of the system.

Next, the system determines whether the change in absolute value of the bridge output is greater than zero (step 604). In one embodiment, the change in absolute value of the bridge output may be determined over a finite time period also referred to as a preselected delay. The change in absolute value may be determined by the difference between the current value and the zero offset or between the current value and a slow changing reference value. If the change in absolute value of the bridge output is not greater than zero, the system implements a preselected delay (step 606) before performing the measurements observed in step 602. In one embodiment, the preselected delay may be 5 ms. However, the preselected delay may be configured or set based on circumstances or needs of the user. In one embodiment, the user may preselect the delay by providing a command, feedback, or instructions to the system.

If the system determines that the change in absolute value of the bridge output is greater than zero in step 604, the system then determines whether the change in absolute value of the bridge output is greater than a threshold ($V_{threshold}$), (step 608).

If the system determines that the change in absolute value of the bridge output is above the threshold in step 608, the system determines that a fast change of the bridge output has occurred and processes the change accordingly (step 610). The bridge output exceeding the threshold indicates that the output change of the system is significant, thus indicating that a fast signal has been detected. In one embodiment, a slow control algorithm may be utilized by the microcontroller to balance the circuit. In one example, a fast-changing parameter, such as mechanical strain, pressure, vibration, or other similar factor, may be detected by the system. The threshold may be selected based on the conditions of the system. For example, the threshold ($V_{threshold}$) may be set such that the changes in the system resulting from a slow signal are below the threshold utilized in step 608. In one embodiment, the bridge output may be processed by communicating the bridge output to one or more internal or external systems, equipment, devices, or components. In one embodiment, the fast signal output should not affect the offset signal; instead, the microcontroller may ensure that the quasi-constant slow signal level remains at half the full-scale level. The fast signal may be saved at an interval short enough to not be distorted by the slow signal drift.

If the change in the absolute value of the bridge value is determined to be below the threshold during step 608, the system recognizes and updates a slow change of the bridge output and adjusts an offset voltage to return a bridge output [value] of zero (step 612). A bridge output below the threshold is indicative of a slow signal or small change to the bridge output. As a result, the offset voltage is adjusted to ensure that the change in absolute value of the bridge output returns to zero to prevent chopping or railing of a fast signal received in the future. FIG. 6 shows how a single multiplexed bridge output signal may be utilized to compensate for the different read signals and to generate associated outputs. The slow changes may be tracked throughout time to ensure that the offset may be properly calculated and that the fast signal and slow signal may be accurately demultiplexed from the signal based on the ongoing feedback into the circuit. For example, a memory within the circuit or microcontroller may store or log changes in the slow signal to adjust offsets, thresholds, or reference values of the circuit. Similarly, the changes in the fast signals may be recorded for reference purposes and to further tune the circuit to best detect the fast signals. In one embodiment, steps 604-612 and 608 may be performed by the microcontroller. However, the various steps may be implemented singly or jointly by various portions of the circuit and tools as are herein described.

One embodiment provides a system, method, device, and circuit for determining signals. A bridge output is received from a Wheatstone bridge sensing a slow signal and a fast signal. A slow output associated with the slow signal and a fast output associated with the fast signal are determined from the bridge output utilizing a microcontroller. The microcontroller generates the offset signal in response to the slow output.

In additional embodiments, the Wheatstone bridge may include a first set of sensors for sensing the slow signal and a second set of sensors for sensing the fast signal in a downhole environment. The output may be digitized for processing by the microcontroller by an analog-to-digital converter. The offset signal may be converted to an analog signal by a digital-to-analog converter. The determination of the slow output and the fast output may be generated at a preselected time period. The determination of the slow output and the fast output may include determining whether the output is greater than zero and determining whether the output is greater than a threshold in response to determining the bridge output is greater than zero. The output may be determined to be associated with the fast signal in response to the output being greater than the threshold. The output may be determined to be associated with the slow signal in response to the output being less than the threshold. The first set of sensors and the second set of sensors may be remotely located from the remaining portion of a circuit. The circuit may be part of a downhole tool for utilization in natural resource exploration.

Another embodiment provides a circuit in a downhole tool. The circuit may include a Wheatstone bridge comprising first sensors for detecting a fast signal and second sensors for detecting a slow signal. The circuit includes an operational amplifier connected to the Wheatstone bridge and configured to receive a bridge output from the Wheatstone bridge and generate an output. The operational amplifier offsets the output based on an offset signal. The circuit includes an analog-to-digital converter connected to the operational amplifier and configured to convert the output to a digital bridge output. The circuit includes a microcontroller connected to the analog-to-digital converter configured to separate a fast output and a slow output from the digital output. The slow output is utilized to generate the offset signal.

In additional embodiments, the microprocessor may generate an offset that is converted to the offset signal by a digital-to-analog converter. The first sensors and the second sensors may be resistive sensors. The microcontroller may adjust the offset signal in response to the digital output being below a threshold indicating a change in the slow signal. The microcontroller may process the digital output as a fast signal in response to the digital output being above a threshold.

In the previous embodiments, reference is made to the accompanying drawings that form a part hereof. These embodiments are described in sufficient detail to enable those skilled in the art to practice the invention, and it is understood that other embodiments may be utilized and that logical, structural, mechanical, electrical, and chemical changes may be made without departing from the scope of the invention. To avoid detail not necessary to enable those skilled in the art to practice the embodiments described herein, the description may omit certain information known to those skilled in the art. The detailed description is, therefore, not to be taken in a limiting sense, and the scope of the illustrative embodiments is defined only by the appended claims.

In the drawings and description that are included, the drawing figures are not necessarily to scale. Certain features of the invention may be exaggerated in scale or in somewhat schematic form and some details of conventional elements may not be shown in the interest of clarity and conciseness.

The previous detailed description is of a small number of embodiments for implementing the invention and is not intended to be limiting in scope.

What is claimed:

1. A method for determining signals, the method comprising:
   receiving a bridge output from a Wheatstone bridge sensing a slow signal with slow sensors and a fast signal with fast sensors, an operational amplifier connected to the Wheatstone bridge configured to receive the bridge output and generate an output, and an analog-to-digital converter connected to the operational amplifier and configured to convert the output to a single digital output; and
   demultiplexing the single digital output to determine a slow output associated with the slow signal and a fast output associated with the fast signal from the bridge output utilizing a microcontroller, wherein the microcontroller generates an offset signal in response to only the single digital output, wherein the offset signal ensures that the fast output is not clipped by an operational amplifier.

2. The method according to claim 1, wherein the slow signal and the fast signal are amplified by an operational amplifier that receives the offset signal generated by the microcontroller in response to the slow output.

3. The method according to claim 1, wherein the bridge output is digitized for processing by the microcontroller by an analog-to-digital converter, and wherein the offset signal is converted to an analog signal by a digital-to-analog converter.

4. The method according to claim 1, wherein the determining is performed at a preselected time period.

5. The method according to claim 1, wherein the determining further comprises:
   determining whether the bridge output is greater than zero; and
   determining whether the bridge output is greater than a threshold.

6. The method according to claim 5, wherein the bridge output is determined to be associated with the fast signal in response to the bridge output being greater than the threshold.

7. The method according to claim 5, wherein the bridge output is determined to be associated with the slow signal in response to the bridge output being less than the threshold.

8. The method according to claim 1, wherein the first set of sensors and the second set of sensors are remotely located from a remaining portion of a circuit.

9. The method according to claim 8, wherein the circuit is part of a downhole tool for utilization in natural resource exploration.

10. A circuit in a downhole tool, the circuit comprising:
    a Wheatstone bridge comprising first sensors for detecting a fast signal and second sensors for detecting a slow signal;
    an operational amplifier connected to the Wheatstone bridge configured to receive a bridge output from the Wheatstone bridge and generate an output, wherein the operational amplifier offsets the output based on an offset signal;
    an analog-to-digital converter (ADC) connected to the operational amplifier and configured to convert the output to a digital output;
    a microcontroller connected to the ADC configured to demultiplex the digital output to determine a fast output and a slow output, wherein only the digital output is utilized to generate the offset signal, and the offset signal ensures that the fast output is not clipped by the operational amplifier.

11. The circuit according to claim 10, wherein the microprocessor generates an analog offset that is converted to the offset signal by a digital-to-analog converter (DAC).

12. The circuit according to claim 10, wherein the first sensors and the second sensors are resistive sensors utilized in the downhole tool.

13. The circuit according to claim 10, wherein the microcontroller adjusts the offset signal in response to the digital output being below a threshold indicating a change in the slow signal.

14. The circuit according to claim 10, wherein the microcontroller processes the digital output as a fast signal in response to the digital output being above a threshold.

15. An application-specific integrated circuit (ASIC) comprising:
    a Wheatstone bridge sensor for detecting a fast signal and a slow signal, wherein the Wheatstone bridge includes a first set of sensors for sensing the slow signal and a second set of sensors for sensing the fast signal and wherein the Wheatstone bridge sensor outputs a sum of the slow signal and the fast signal as a bridge output;
    a processor in communication with the Wheatstone bridge for executing a set of instructions; and
    a memory in communication with the processor for storing the set of instructions to configure a logic, wherein the logic is operable to:
    receive the bridge output;
    demultiplex the bridge output to determine a slow output associated with the slow signal and a fast output associated with the fast signal; and
    generate an offset signal in response to only the bridge output, wherein the offset signal ensures that the fast output is not clipped by an operational amplifier.

16. The ASIC according to claim 15, wherein the output is determined to be associated with the fast signal in response to the output being greater than the threshold, and wherein the output is determined to be associated with the slow signal in response to the output being less than the threshold.

17. The ASIC according to claim 15, wherein the logic includes a microcontroller, an analog-to-digital converter, and a digital-to analog converter, and wherein the logic digitizes the output for processing by the microcontroller utilizing an analog-to-digital converter, and wherein the offset signal is converted to an analog signal by the digital-to-analog converter.

18. The ASIC according to claim 15, wherein the ASIC is part of a downhole tool for utilization and natural resource exploration, and wherein the Wheatstone bridge is remotely attached to the ASIC.

* * * * *